United States Patent
Iff et al.

(10) Patent No.: US 12,079,979 B2
(45) Date of Patent: Sep. 3, 2024

(54) METHOD AND A SYSTEM FOR CHARACTERISING STRUCTURES THROUGH A SUBSTRATE

(71) Applicant: UNITY SEMICONDUCTOR, Montbonnot-Saint-Martin (FR)

(72) Inventors: Wolfgang Alexander Iff, Domène (FR); Alain Courteville, Congenies (FR)

(73) Assignee: UNITY SEMICONDUCTOR, Montbonnot-Saint-Martin (FR)

( * ) Notice: Subject to any disclaimer, the term of this patent is extended or adjusted under 35 U.S.C. 154(b) by 0 days.

(21) Appl. No.: 18/319,281

(22) Filed: May 17, 2023

(65) Prior Publication Data
US 2023/0377121 A1    Nov. 23, 2023

(30) Foreign Application Priority Data

May 19, 2022   (EP) .................................... 22305745

(51) Int. Cl.
*G01N 21/88*   (2006.01)
*B81C 99/00*   (2010.01)
(Continued)

(52) U.S. Cl.
CPC .......... *G06T 7/0004* (2013.01); *B81C 99/003* (2013.01); *G01B 11/22* (2013.01);
(Continued)

(58) Field of Classification Search
CPC ......... G06T 7/0004; G06T 7/521; G06T 7/60; G06T 2207/30148; B81C 99/003; G01B 11/22
See application file for complete search history.

(56) References Cited

U.S. PATENT DOCUMENTS

| | | | |
|---|---|---|---|
| 8,120,002 B2 * | 2/2012 | Van Dijk | G01J 3/4406 250/559.4 |
| 8,213,022 B1 | 7/2012 | Riza et al. | |

(Continued)

FOREIGN PATENT DOCUMENTS

| | | | |
|---|---|---|---|
| JP | 2001203424 A | | 7/2001 |
| JP | 2021-118583 | * | 7/2021 |
| WO | 2007042676 A1 | | 4/2007 |

OTHER PUBLICATIONS

Search Report received for European Application No. 22305745.6, mailed Nov. 30, 2022.

(Continued)

*Primary Examiner* — Patrick E Demosky
(74) *Attorney, Agent, or Firm* — Greer, Burns & Crain, Ltd (57) ABSTRACT

A method for characterizing structures etched in a substrate, such as a wafer is disclosed. The method includes the following steps: illuminating the bottom of at least one structure with an illumination beam issued from a light source emitting light with a wavelength adapted to be transmitted through the substrate, acquiring, with an imaging device positioned on the bottom side of said substrate, at least one image of a bottom of the at least one structure through the substrate, and measuring at least one data, called lateral data, relating to a lateral dimension of the bottom of the at least one HAR structure from the at least one acquired image. A system implementing such a method is also disclosed.

13 Claims, 4 Drawing Sheets

(51) Int. Cl.
*G01B 11/22* (2006.01)
*G06T 7/00* (2017.01)
*G06T 7/521* (2017.01)
*G06T 7/60* (2017.01)

(52) U.S. Cl.
CPC ............... *G06T 7/521* (2017.01); *G06T 7/60* (2013.01); *G06T 2207/30148* (2013.01)

(56) References Cited

U.S. PATENT DOCUMENTS

| | | | |
|---|---|---|---|
| 9,859,139 B2* | 1/2018 | Cheng | G01B 11/14 |
| 2009/0051932 A1* | 2/2009 | Heiden | G01B 11/03 |
| | | | 356/614 |
| 2010/0271621 A1* | 10/2010 | Levy | G03F 7/70658 |
| | | | 356/73 |
| 2013/0038863 A1* | 2/2013 | Fresquet | G02B 21/0016 |
| | | | 356/73 |
| 2014/0036273 A1 | 2/2014 | Lee et al. | |
| 2016/0161730 A1 | 6/2016 | Nakamura | |
| 2023/0018318 A1* | 1/2023 | Hirano | G01N 21/88 |
| | | | 382/100 |

OTHER PUBLICATIONS

Heulbi, A., et al., "Optical Fiber-Based Confocal and Interferometric System for Measuring the Depth and Diameter of Through Silicon Vias," Journal of Lightwave Technology, IEEE, vol. 34, No. 23, Dec. 1, 2016, pp. 5462-5466.

Ku, Y., "Spectral reflectometry for metrology of three-dimensional through-silicon vias," J. Micro/Nanolith. MEMS, and MOEMS 13(1), Jan.-Mar. 2014, pp. 011209-1 to 011209-10.

* cited by examiner

METHOD AND A SYSTEM FOR CHARACTERISING STRUCTURES THROUGH A SUBSTRATE

BACKGROUND

The present invention relates to a method for characterising structures, and in particular high aspect ratio structures etched in a substrate. It also relates to a system implementing such a method.

The field of the invention is the field of the inspection and the characterization of structures etched in a substrate, such as high aspect ratio structures, for example Through-Silicon Vias (TSV) or trenches, etched in a substrate, such as a semiconductor wafer.

In the semiconductor industry, for instance in the MEMs (for "Microelectromechanical systems") industry, many process steps involve etching structures with sometimes high aspect ratios in substrates such as silicon. Such a structure with high aspect ratio, "HAR structure" in the following, may comprise for instance Through Silicon Vias (TSVs) which are usually blind holes used for example for interconnections in advanced packaging techniques, trenches with narrow width and elongated length, and more complex features. They may be realized by Deep Radiative Ion Etching (Deep RIE) or photolithography techniques for instance.

The aspect ratio of an HAR structure is defined by the ratio between the depth and a lateral dimension, also called "critical dimension" (CD) of the HAR structure. Some HAR structures may have aspect ratios larger than 5, or 10 or 20, with lateral (critical) dimensions as narrow as 5 µm or less. Some non-limitative examples comprise TSVs in the form of cylindrical holes with diameters of 2-3 µm and depths of 40-50 µm, etched in silicon substrates.

There is a need to measure and characterize each structure by measuring for instance its critical dimension at the bottom of the structure, which is embedded into the substrate. This bottom CD may differ from a critical dimension at the top of the structure (top-CD), and thus is an important information. A known technique is described in Yi-Sha Ku, "Spectral reflectometry for metrology of three-dimensional through-silicon vias," J. Micro/Nanolith. MEMS MOEMS 13(1) 011209 (6 Mar. 2014), which allows measuring depth profiles of arrays of TSVs by spectroscopic reflectometry. However, this method does not allow for characterizing individually TSVs or other structures, but only dense arrays of TSVs by using a light spot covering a plurality of TSVs. In addition, this method requires an accurate modelling of the measurement signal, which is difficult to achieve in practice.

SUMMARY

A purpose of the present invention is to overcome at least one of the drawbacks of the known techniques.

Another purpose of the invention is to provide a solution to characterize structures, and in particular HAR structures, by measuring the critical dimension at their bottom (Bottom-CD).

Another purpose of the invention is to provide a solution to characterize structures, and in particular HAR structures, by measuring their depth.

Another purpose of the invention is to provide a solution to characterize structures, and in particular HAR structures individually.

Another purpose of the invention is to provide a solution to characterize structures, and in particular HAR structures of small critical dimension.

It is also a purpose of the present invention to provide a solution to characterize structures, and in particular HAR structures more efficiently and/or faster.

At least one of these aims is achieved by a method for characterizing structures, and in particular high aspect ratio (HAR) structures etched in a substrate, such as a wafer, the method comprising the following steps:
- illuminating the at least one structure with an illumination beam issued from a light source emitting light with a wavelength adapted to be transmitted through the substrate,
- acquiring, with an imaging device positioned on the bottom side of said substrate, at least one image of a bottom of said at least one structure through the substrate, and
- measuring at least one data, called lateral data, relating to a lateral dimension of the bottom of said at least one structure from the at least one acquired image.

The method according to the present invention proposes measuring lateral data relating to structures, and in particular HAR structures etched in a substrate at the bottom of these structures, thanks to an imaging device positioned at the bottom side of the substrate and by processing at least one image captured by this imaging device. The lateral data represents a valuable information when characterizing these structures. In particular, the lateral dimension of a bottom of a HAR structure may be different from its lateral dimension at the top. The bottom lateral dimension may thus advantageously complete depth and/or top lateral dimension data obtained for one individual structure or HAR structure.

The method according to the present invention is implemented using a light source emitting light with at least a wavelength, or a wavelength range, adapted to be transmitted through the material of the substrate. Thereby, imaging of a bottom of a structure is realized through the substrate, from the bottom side of the substrate. The lateral data of the structure at its bottom can then be obtained from an acquired image, by applying any known image processing method, such as image segmentation, feature extraction, or identification or blob detection.

In the present document, a "high aspect ratio structure" or "HAR structure" designates a structure with an aspect ratio greater than, or equal to, 5, or 10, or even 20.

For example, a structure such as a HAR structure may be a Through Silicon Via (TSV), a trench, and a more complex feature, etched in a substrate such as a wafer.

In the present document, the terms "top side" or "top surface" of a substrate correspond to the side or to the surface on which the structure(s) are etched. The term "bottom side" corresponds to the side of the substrate opposite to the top side. Further, the term "bottom of a structure" designates the bottom of a via, a trench, or any other etched structure, or in other words, the deepest part of the structure in the substrate.

In the present document, "a lateral dimension of the bottom of the at least one structure, or HAR structure" may designate:
- a diameter or a section at the bottom of a hole or a via (TSV),
- the width of a trench at its bottom, or
- any dimension within or between various pattern elements of an etched structure at its bottom.

This lateral dimension, or critical dimension, is also called bottom CD.

The lateral data relating to one single structure or to several structures may be deduced from a single image captured by the imaging device. Alternatively, or in addition, the lateral data relating to one single structure or to several structures may be deducted from several images captured by the imaging device.

At least one image captured by the imaging device may relate only to one single structure: in this case the captured image only comprises information regarding this single structure and does not comprise information regarding any other structure of the substrate.

Alternatively, or in addition, at least one image captured by the imaging device may relate to several or all structures of the substrate: in this case the captured image comprises information regarding each of said structures so that it is possible de determine the lateral data for each of said structures by processing the captured image.

According to an embodiment, the step of acquiring at least one image of a bottom of the at least one structure may comprise a step of scanning, for instance with the imaging device, said at least one structure and/or the substrate below said at least one structure along a direction, z, corresponding to a depth direction of said structure.

Thanks to the scanning step, it is ensured that it is the bottom of a structure that is imaged, and not another part of the structure between the top and the bottom of that structure. The scanning step allows notably for researching and identifying the image of the bottom out of images of other parts of the structure or the substrate.

According to an example, the step of scanning may comprise:
- moving an object plane optically conjugate of an image plane of the imaging device along the z direction,
- acquiring an image or a sequence of images of the object plane at different positions of the object plane along the z direction, and
- identifying at least one image of a bottom of the at least one structure, acquired with the object plane positioned at a bottom of the at least one structure.

The scan may be realized following a depth direction within the HAR structure, starting from the top surface of the substrate.

The scan may also be realized within the substrate, starting from the bottom surface of the substrate towards the bottom of the HAR structure.

The step of identifying at least one image of a bottom may comprise at least one of the following steps:
- detecting a transition in the sequence of images between the at least one structure and the substrate below it, for instance to ensure that the deepest images of the structure corresponding to the bottom are identified
- measuring the sharpness or the spatial frequencies of the acquired images, for instance to identify images of the bottom in focus.

Of course, other image processing techniques may be employed to identify an image of a bottom of a structure.

According to an embodiment, the method may further comprise a step of measuring at least one depth data relating to a depth of the at least one structure.

The measurement of the depth data, additionally to the measurement of the lateral data of the bottom of the structure, allows to complete the characterization of the considered structure.

According to an embodiment, the step of acquiring at least one image of a bottom of the at least one structure may be realized using the measured depth data.

In particular, the depth data may be used to position the object plane of the imaging device on the bottom of the structure or close to this bottom. This allows for limiting the range of scanning of the object plane, or even to avoid the step of scanning by being able to position the object plane of the imaging device directly at the bottom of the structure. The object plane of the imaging device may thus be positioned on the bottom of the structure more quickly and more efficiently.

According to some embodiments, the step of measuring at least one depth data relating to a depth of the at least one structure may be carried out with a low-coherence interferometer positioned on the top side of the substrate operating.

According to an embodiment, such interferometer may operate in full field.

According to an embodiment, such interferometer may have a point measurement beam. In that case, the interferometer is able to measure the depth of a single structure.

According to an example, the at least one lateral data may comprise a position data relating to a position of the bottom of the at least one structure, the method further comprising a step of adjusting the position of the measurement beam of the interferometer on a top surface of the substrate according to the position data.

The step of acquiring at least one image thus provides information relative to the position of the bottom of the structure, and thereby the position of the structure itself, by processing at least one image acquired by the imaging device. The position of said structure on the substrate is then used for faster and more accurate positioning of the measurement beam of the low-coherence interferometer. The measurement of the depth of the structure is then carried out faster and more accurately compared to known techniques.

According to another example, or in addition, the at least one lateral data may comprise a bottom-CD data relating to a lateral dimension of the at least one structure at the bottom, the method further comprising a step of adjusting a diameter of the measurement beam according to the bottom-CD data.

The step of acquiring at least one image thus provides the bottom-CD data, which are then used during an adjusting step for adjusting the diameter of the measurement beam.

Thus, the method according to the invention allows faster and more accurate measurements of the depth of structures in a substrate when the bottom-CD data of said structures are not known, and/or when the substrate comprises different structures with different bottom-CDs.

When using a low-coherence interferometer with a point measurement beam, this adjustment of the diameter of the measurement beam according to a bottom-CD of a structure, and in particular of a HAR structure, allows to have most of the incident measurement beam entering the structure, while only a small part of it is reflected at the top surface. Indeed, due to the rather small ratio of lateral dimension of the structure vs. applied wavelengths (often below 15), which leads to strong diffraction effects, and often also due to absorbing properties of the involved materials, e.g., silicon, or more generally speaking due to the conditions of propagation into these structures, the losses inside these structures are high, and only a small part of the incoming light is reflected from the bottom of the structure and coupled back into the interferometer.

The sensitivity of the interferometric measurements is thus optimized by adjusting the diameter of the measurement beam so that most of the incident power is used to compensate for the high losses in the structure. This allows obtaining more balanced interference signals, with for instance a higher contrast or a larger modulation amplitude.

The optimum portion of the interferometer light to be focused into the structure depends notably on the losses of light inside the structure. These losses depend notably on the lateral dimensions or the diameter (e.g. top- and bottom-CD), the depth, and the shape of the structure (e.g. the shape of the bottom and the shape of the sidewalls). For example, structures with smaller diameters and larger depths lead to higher losses and require the coupling of a larger portion of the power into the structure. The measurement beam size on the substrate may thus be adapted according to these constraints.

The diameter of the measurement beam on the top surface may for example be adjusted or defined so that at least 75%, or 80%, or 90% of the incoming power is coupled into the structure.

Another advantage of the adjustment of the size of the measurement beam is that the measurement beam is limited enough to cover only one structure, even for arrays of structures close to each other, which allows ensuring that the structures can be individually characterized.

The diameter of the measurement beam may be adjusted by changing:
  at least one optical element, such as a lens or a beam expander, placed between the interferometer and the substrate;
  at least one focal length of an optical element, such as a lens or a zoom arrangement, placed between the interferometer and the substrate; and/or
  a numerical aperture of the measurement beam.

The changing of the optical element may be realized by any means. For example, the change of the optical element may be realized with a turret moving or supporting said at least one optical element.

The change of the focal length of the optical element may be carried out by changing the zoom ratio of said optical element, or the position of a component of a zooming arrangement composing said optical element.

Alternatively, or in addition with at least one of the previous options, the adjustment of the diameter, on the top surface, of the measurement spot may be carried out by changing a numerical aperture of the measurement beam on the top surface. The numerical aperture of the measurement beam may be changed by using a beam expender in a collimated beam path or an aperture stop.

According to another aspect of the same invention, it is proposed a system for characterizing structures, and in particular high aspect ratio (HAR) structures etched in a substrate, such as wafer, the system comprising:
  at least one light source for illuminating a structure, the at least one light source emitting light of a wavelength adapted to be transmitted through the substrate;
  an imaging device positioned on the bottom side of said substrate for acquiring at least one image of the bottom of the structure through the substrate; and
  image processing means for measuring at least one data, called lateral data, relating to a lateral dimension of the bottom of the HAR structure from the at least one acquired image.

The image processing means may provide at least one lateral data comprising, or consisting in, a position data relating to a position of the bottom of at least one structure, for instance in the image or relative to the substrate.

Alternatively, or in addition, the image processing means may provide at least one lateral data comprising, or consisting in, a bottom-CD data relating to a lateral dimension of the at least one structure at the bottom.

According to an embodiment, the system may further comprise focus controlling means configured to:
  move an object plane optically conjugate of an image plane of the imaging device along the z direction,
  acquire an image of the object plane at different positions of the object plane along the z direction, and
  identify at least one image of a bottom of the at least one structure, acquired with the object plane positioned at a bottom of the at least one structure.

The focus controlling means thus ensure that it is actually the bottom of a structure that is imaged, and not any other part of the structure. In some embodiments, the at least one light source may be positioned on a bottom side of the substrate.

In this case, the illumination of the bottom of at least one structure is done in reflection.

Alternatively, or additionally, the at least one light source may be positioned on a top side of the substrate.

In this case, the illumination of the bottom of at least one structure is done in transmission.

For both illumination schemes, the at least one image has to be acquired through the substrate, so the at least one light source shall have wavelengths able to be transmitted through this substrate.

As an example, in the case of a silicon substrate, the light source shall have a spectrum in the infrared, with wavelengths longer than 900 nm or 1000 nm.

According to an embodiment, the imaging device may comprise a camera and optical imaging means.

The imaging device is advantageously configured to image the bottom of the at least one structure, and not a part of the structure between its top and bottom. This is important, as the dimension of a structure may vary from top to bottom. So, the imaging device is advantageously configured to image only a narrow slice of the at least one structure at the bottom, so that the measured lateral data correspond to that slice, and not to an averaged data over a larger part of the structure.

For instance, the imaging device may be configured to have a depth of field smaller than $1/5$ or $1/10$ of the depth of a structure, or a HAR structure under measurement. This criterion can be for instance applied for measuring HAR structures having a depth of about 50 µm, which leads to a depth of field (DoF) smaller than 5 µm to 10 µm.

According to an example, the imaging device may comprise a confocal imaging arrangement.

Such an arrangement allows for imaging only a very thin layer of the structure.

According to another example, the imaging device may comprise an imaging arrangement with a numerical aperture (NA) at the object equal to or higher than 0.4.

Thus, the imaging device has a very narrow depth of field.

In the configuration of the invention, the image of the bottom of the structure is acquired through a thick layer of substrate. For some wafers, for instance, the image may be acquired through a layer of 725 µm of silicon. In that case, it may suffer from optical aberrations, such as spherical aberrations.

So, the imaging device may comprise optical compensation means configured to compensate for aberrations induced by the path of the light through the substrate, such as spherical aberrations.

The imaging device may notably comprise an objective lens with a compensator of spherical aberrations.

Such compensator may be obtained by an optical lens arrangement introducing spherical aberrations complementary to the ones due to a given layer of substrate.

Advantageously, the system according to the invention may further comprise a low-coherence interferometer for measuring, with a measurement beam, at least one depth data relating to a depth of the structure.

The interferometer may be for instance a time-domain interferometer. In that case, it comprises a broadband source emitting polychromatic light. It further comprises an optical delay line which allows varying an optical path difference between two beams. When the optical path difference between the beams reflected respectively at the top and the bottom of the structure, or between these respective beams and a reference beam, is reproduced by the delay line, an interference burst, or fringe, can be observed on a photodetector, allowing measuring this optical path difference. The depth of the structure is deducted from said optical path difference.

The interferometer may also be a spectral-domain interferometer. In that case, it comprises a broadband source emitting polychromatic light and a spectrometer for a spectral analysis of the reflected light. The spectrum obtained by combining the light reflected respectively by the top and the bottom of the structure on the spectrometer exhibit well-known patterns such as modulations whose analysis can provide the optical path difference between the superposed beams. The depth of the structure is deduced from said optical path difference.

The interferometer may also comprise a swept-source interferometer, with a tunable laser emitting monochromatic light with an optical frequency varying temporally over a spectral range. The intensity of the reflected light is measured by a photodetector, so as to reconstitute a spectrum, whose analysis allows also to measure the optical path difference between the reflected beams, and thus the depth of the structure.

In some embodiments, the interferometer may be coupled to an optical fibre conveying the measurement beam and the reflected light. This optical fiber may be preferably a single-mode fiber The interferometer may be for example similar to the one described in the document published under the number WO2007/042676.

BRIEF DESCRIPTION OF THE DRAWINGS

Other advantages and characteristics will become apparent on examination of the detailed description of an embodiment which is in no way limitative, and the attached figures, where.

DETAILED DESCRIPTION

It is well understood that the embodiments that will be described below are in no way limitative. In particular, it is possible to imagine variants of the invention comprising only a selection of the characteristics described hereinafter, in isolation from the other characteristics described, if this selection of characteristics is sufficient to confer a technical advantage or to differentiate the invention with respect to the state of the prior art. Such a selection comprises at least one, preferably functional, characteristic without structural details, or with only a part of the structural details if this part alone is sufficient to confer a technical advantage or to differentiate the invention with respect to the prior art.

In the FIGURES, elements common to several figures may keep the same reference.

Figure 1:
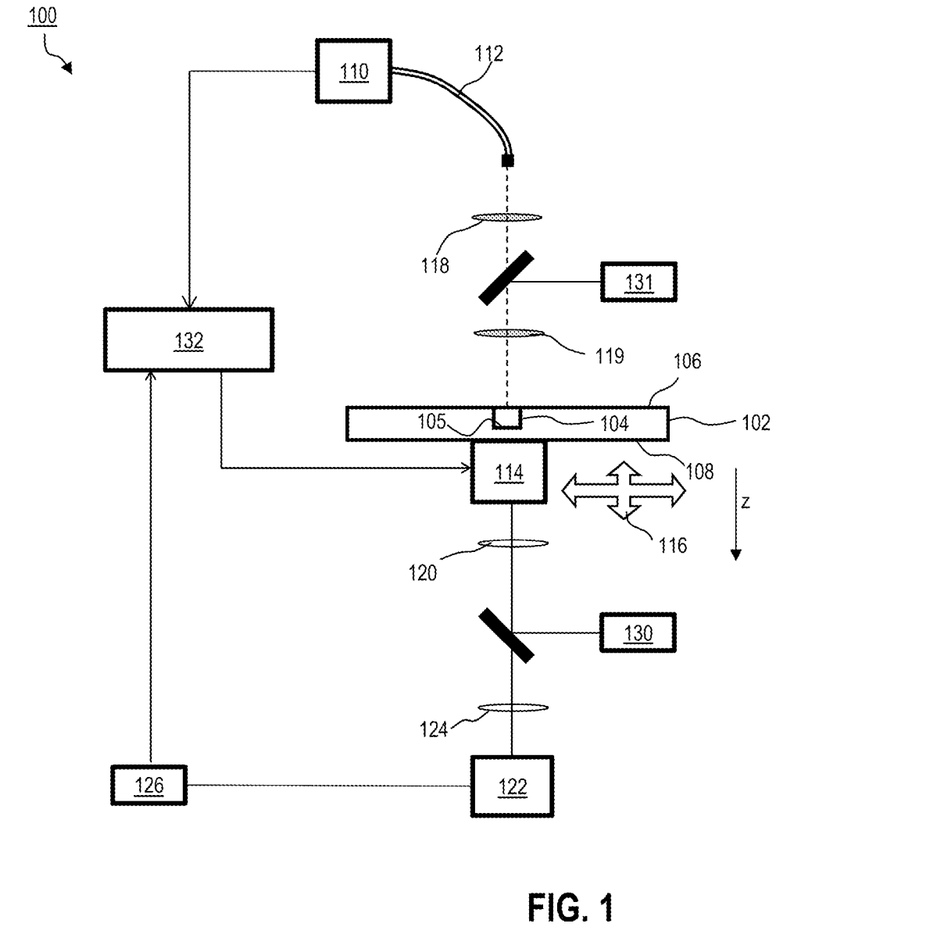
FIGS. 1 and 1a are a diagrammatic representation of a non-limitative example of a system according to the invention.

FIG. 1 is a diagrammatic representation of a non-limitative example of a system according to the present invention.

The system 100, represented in FIG. 1, may be used to characterise structures, and in particular HAR structures, etched in a substrate, such as a wafer. More particularly, the system 100 may be used to measure a lateral data of the bottom of structures etched in the substrate.

As represented in FIG. 1, the system 100 is used to characterize structures etched in a substrate 102, such as a wafer. In FIG. 1, for ease of understanding only one structure 104 is represented. Of course, the substrate may comprise more than one structure. The structure 104 may for example be a trench etched in the substrate 102 from the top surface 106 of the substrate 102. The substrate 102 also comprises a bottom surface 108 opposite to the top surface.

Figure 1A:
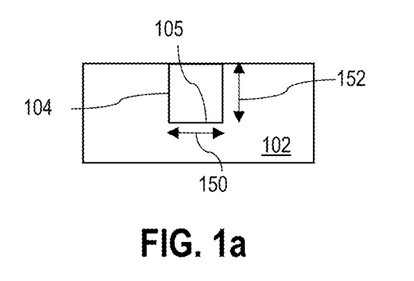

FIG. 1a illustrates the information to be measured on the structure 104 etched in a substrate 102, namely the bottom-CD 150 and possibly the depth 152. In the example illustrated, the structure 104 may be for instance a hole or a TSV, and the lateral data or the bottom-CD data 150 may be representative of the inner diameter of the structure at its bottom 105. The structure 104 may be also an elongated trench, and the bottom-CD 150 may be its smallest transverse dimension, or its width, at its bottom 105.

The system 100 comprises an imaging device for acquiring at least one image through the substrate 102, more particularly of the bottom 105 of the structures 104 etched in the substrate 102, and image processing means for said at least one captured image for determining at least one first data relative to at least one structure of the substrate 102.

The imaging device is positioned on the side of the bottom surface 108 of the substrate 102. As represented in the non-limitative example of FIG. 1, the imaging device comprises a camera 122, a back side lens 120, and a tube lens 124 to image through the bottom surface 108 of the substrate 102 on the camera 122.

The imaging device is configured to have a very narrow depth of field, in order to ensure to image only a narrow slice of the structure at the bottom, so that the measured lateral data correspond to that slice, and not to an averaged data over a larger part of the structure. Therefore, the imaging device uses a back side lens 120 with a numerical aperture (NA) of 0.4 or higher, such as a microscope objective with a magnification ×20 of higher.

The back side lens 120 may also comprise compensation means (not shown) configured to compensate for aberrations, and in particular spherical aberrations induced by the path of the light through the substrate 102. Otherwise, the acquired image may have a degraded resolution, in particular if the image is acquired through a thick layer of substrate, such as for instance 725 µm of silicon. The compensation means may comprise, for example, an optical arrangement which introduces a spherical aberration of opposite effect.

The system 100 also comprises a light source 130 arranged at the back or bottom side of the substrate 102. The wavelength(s) emitted by the light source 130 are adapted to be transmitted through the material of the substrate. For instance, if the substrate is silicon, the light source shall emit light with wavelengths longer than 1 µm or 1.1 µm. The light source 130 illuminates the back side of the substrate 102 and thus one or more bottoms 105 of structures 104 etched in the substrate 102, in reflection.

Alternatively, or in addition, a light source 131 may also be arranged on the top side of the substrate. In this case, the wavelength must also be adapted to be transmitted through the material of the substrate. For instance, if the substrate is silicon, the light source shall emit light with wavelengths longer than 1 µm or 1.1 µm. The light source 131 illuminates the top surface 106 of the substrate 102 and thus one or more structures 104 etched in the substrate 102. So these structures 104, and in particular their bottom 105, are illuminated in transmission, through the structures themselves and through the surrounding substrate.

The camera 122 is configured to capture/acquire at least one image of a bottom of at least one structure 104 etched in the substrate 102. The acquired image is processed, by standard image processing techniques executed by a processing module 126, for measuring a lateral data relative to a lateral dimension of a bottom 105 of at least one structure 104. The processing module 126 may be a hardware module, such as a processor or a chip, or a software module such as a computer program. The processing of the image may comprise notably a segmentation, and/or a pattern detection to identify the structure in the image.

Advantageously, the system 100 further comprises a focus controller. The focus controller is preferably implemented with the processing module 126. Alternatively, it may also be implemented in a second, separate processing module (not shown). The focus controller is used in order to ensure that, when imaging a bottom 105 of a structure 104, it is actually the bottom 105 of the structure 104 that is imaged, and not another part of the structure 104.

The focus controller is configured to move an object plane optically conjugate of an image plane of the imaging device (for instance on the camera) along the z direction. To move the object plane, according to an example, the back side lens 120 may be moved along the z direction. Alternatively, the imaging device may be moved globally relative to the substrate 102, or reversely, along the z direction. The focus controller is further configured to control the acquisition of an image of the object plane at different positions of the object plane along the z direction, and to identify at least one image of a bottom 105 of a structure 104, i.e., an image acquired with the object plane positioned at a bottom 105 of the at least one structure 104.

The system 100 according to the embodiment as represented in FIG. 1 further comprises optionally a low-coherence interferometer 110 placed on the side of top surface 106 of the substrate 102. The low-coherence interferometer 110 is used to measure at least one data relative to the depth of the structure 104, and particularly to measure the depth of the structure 104.

The low-coherence interferometer 110 is thus arranged at the opposite side of the substrate with respect to the imaging device.

The interferometer 110 may be for instance a time domain interferometer. In that case, it comprises a broadband source (not shown) emitting a polychromatic light. It further comprises an optical delay line which allows varying an optical path difference between two beams. When the optical path difference between the beams reflected respectively at the top and the bottom of the structure 104, or between these respective beams and a reference beam, is reproduced by the delay line, an interference burst, or fringe, can be observed on a photodetector, allowing measuring this optical path difference. The depth of the structure 104 is deduced from said optical path difference.

The interferometer may also be a spectral domain interferometer. In that case, it comprises a broadband source (not shown) emitting a polychromatic light, and a spectrometer for a spectral analysis of the reflected light. The spectrum obtained by combining the light reflected respectively by the top and the bottom of the structure 104 on the spectrometer exhibit well known patterns such as modulation whose analysis can provide the optical path difference between the superposed beams. The depth of the structure 104 is deduced from said optical path difference.

The interferometer 110 may also comprise a swept source interferometer, with a tunable laser emitting a monochromatic light with an optical frequency varying temporally over a spectral range. The intensity of the reflected light is measured by a photodetector, so as to reconstitute a spectrum, whose analysis allows also to measure the optical path difference between the reflected beams, and thus the depth of the structure 104.

The interferometer 110 may be for example similar to the one described in WO 2007/042676.

Optionally but preferably, the measurement beam emitted by the interferometer 110 and the reflected light received from the substrate 102 may be conveyed from and to the interferometer 110 using a single mode fiber 112 coupled to the interferometer 110.

For measuring narrow structures such as TSVs with diameter smaller than 5 µm, the measurement light source may for example emit light in the visible spectral range, for instance <900 nm, for a better propagation into these structures, in particular with a high aspect ratio (HAR).

The system 100 also comprises a holder 114, such as a wafer chuck, associated to displacement means 116, such as rotary stages, to move and position the substrate 102 in the x-y, and optionally z, directions.

When implementing the interferometer 110, the system 100 also comprises means for adjusting the diameter, on the top surface 106 of the substrate, of the measurement beam emitted by the interferometer 110, in order to adjust the diameter of said measurement beam to the structure under inspection.

In the example shown in FIG. 1, the diameter of the measurement beam may be determined by the core of the fiber 112 or the mode field diameter of the light exiting the fiber, and the magnification provided by the combination of a collimator lens 118 and a front side lens 119. At least one of these lenses 118, 119 can be changed in order to change the magnification, and thus to adjust the diameter, on the top surface 106, of the measurement beam.

The adjusting means may, for example, comprise a turret (not shown) for changing at least one of the lenses 118, 119 and/or varying the focal length of one of the lenses 118, 119, to change the magnification accordingly.

The adjusting means may also comprise a beam expander (not shown) in a section where the measurement beam is collimated, such as between the collimator lens 118 and the front side lens 119. The beam expander modifies the beam diameter and therefore the numerical aperture (NA) with which the beam is focused. This finally defines the diameter of the measurement beam on the top surface 106.

The system 100 comprises a control unit 132. The control unit 132 is configured for controlling the means for adjusting the diameter of the measurement beam. The control unit 132 may, for example, control a turret for changing at least one of the lenses 118, 119. The control unit 132 is also configured for controlling the positioning of the measurement beam emitted by the interferometer 110 on a structure 104. In the embodiment illustrated in FIG. 1, the control unit 132 controls/commands the holder 114 and/or the stage 116.

For at least one structure, the lateral data may comprise the position of a bottom 105 for the structure 104 in the plane of the substrate 102. In this case, when using the interferometer 110, the position of the bottom 105 of the HAR structure 104 may be communicated to the adjusting means to command/control the holder 114 and/or the stage 116, for accurate positioning of the measurement beam emitted by the interferometer 110 relatively to the HAR structure 104.

Alternatively, or in addition, for at least one HAR structure, the lateral data may comprise the bottom-CD of the structure 104. In this case, when using the interferometer 110, the bottom-CD of the structure 104 may be communicated to the adjusting means to command/control a turret for adjusting the diameter of the measurement beam emitted by the interferometer 110.

The system 100 may be implemented in a method according to the invention, in order to characterize structures, and in particular HAR structures, etched in a substrate.

Figure 2:
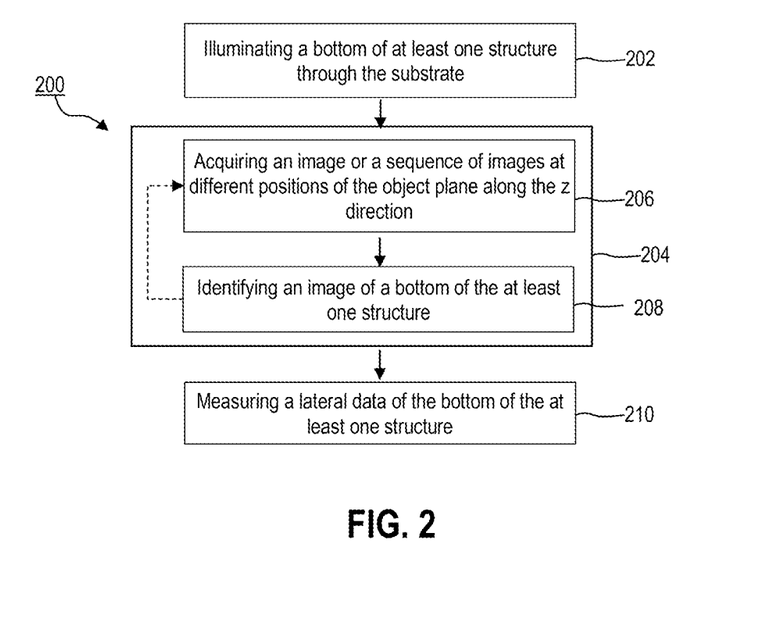
FIGS. 2-4 are diagrammatic representations of non-limitative examples of a method according to the invention.

FIG. 2 is a diagrammatic representation of a non-limitative example of a method according to the present invention. The method may be carried out by a system according to the invention, and in particular the system 100 as represented in FIG. 1.

The method 200, shown in FIG. 2, may be used to characterise structures, and in particular high aspect ratio, HAR, structures etched in a substrate, such as a wafer. More particularly, the method 100 of FIG. 2 may be used to measure a lateral data of a bottom of structures etched in the substrate.

The method 200 comprises a step 202 of illuminating at least one structure, and in particular a bottom of at least one structure. The illumination may be realized by means of a light source positioned on a top and/or a bottom side of the substrate, and of which the emitted light has a wavelength adapted to be transmitted through the substrate.

Following the illuminating step 202, the method 100 comprises a bottom image acquisition step 204. During this step 204, at least one image of the bottom of the at least one structure is captured by an imaging device. The captured image may comprise one or more, or all, bottoms belonging to one or more, or all, structures etched in the substrate.

As previously explained, the imaging device comprises a camera and optical imaging means, such as a microscope arrangement.

The bottom image acquisition step 204 comprises an acquisition step 206 for acquiring one image or a sequence of images at different positions along a depth or z direction. This is achieved by positioning an object plane optically conjugated of an image plane of the imaging device such as the image plane of the camera, at different positions along the z direction. For this, the object plane is moved along the z direction, for example by moving a lens, such as the back side lens 120 of FIG. 1, or the imaging device relatively to the substrate, or reversely, along the z direction.

The bottom image acquisition step comprises also an identification step 208, in which an image of a bottom of at least one structure is identified among a sequence of images, or validated if only one image is acquired. This identification may be realised according to known image processing techniques.

According to an embodiment, it comprises steps of:
identifying the images displaying the structure among the images of a sequence to distinguish them from the images acquired for object planes located in the substrate below the structure, in which the structure is out of focus. This may be done using image processing techniques such as image segmentation, feature extraction or blob analysis, to locale structures in the acquired images;
identifying the images in the sequence of images corresponding to the transition in z between the at least one structure and the substrate below it;
finding the image in the transition area, or the deepmost image, displaying the structure and possibly matching (at best) some quality criteria such as a sharpness or a content in high spatial frequencies, which image may be considered as the best representation of the bottom of the structure, or the image acquired for an object plane coinciding with the bottom of the structure.

Thanks also to the small depth of field of the imaging system, it is sure then that the image identified that way is displaying the bottom of the structure, and not another part of the structure. Of course, if several structures of different depth or complex structures having several bottoms of different depth are present, several images corresponding to these different depths may be retained.

According to an example, the object plane is moved during step 206 through the substrate, starting from the bottom surface of the substrate, until a bottom of a structure appears in the acquired images. The bottom surface of the substrate has the advantage of being a surface easy to find in the images. Then, in step 208, the image displaying the best representation of the bottom of the structure is identified as explained above.

According to another example, the object plane is moved during step 208 through a structure, starting for instance from the top surface of the substrate, until the structure disappears from the images. Then, in step 208, the image displaying the best representation of the bottom of the structure is identified as explained above.

According to another example, the steps 206 and 208 are executed as previously explained, but with a much narrower z scanning range positioned around a pre-identified bottom position of the structure. For that, an a-priori knowledge of the depth of the structure, even approximative, is used. That information can be for instance a nominal or expected depth, known by design. It can also be obtained by measuring the depth of the structure using for instance an interferometer, as explained below. The depth information allows locating the bottom of the structure relative to the top surface of the substrate. In addition, a total thickness of the substrate can also be used, which can be derived also from design information or thickness measurements, for instance with an interferometer. In that case, the bottom of the structure can also be located with respect to the bottom side of the substrate. This method allows faster and also more accurate measurements, in particular by limiting the risk of false detection of bottom.

According to yet another example, using also a-priori knowledge of the location of the bottom obtained as explained previously, one image is acquired at step 206 directly at the estimated location of the bottom. It is then validated at step 208 as explained before, by locating the structure and checking quality criteria. If the image does not satisfy some criteria, another image may be acquired for another z in the neighborhood, and analyzed, and so on, until an image matching the quality criteria is found. In that case a scanning strategy based on the evolution of some criteria of the images in a neighborhood may be implemented to optimize the scanning procedure.

Once the at least one image of the bottom is captured, the image is processed, in a processing step 210, in order to obtain a lateral data of the bottom of the at least one structure. The processing step 210 may comprise a step of identifying the region of the image corresponding to the bottom of the structure using commonly known image processing methods, such as image segmentation, feature extraction, or identification or blob detection, or using that information as obtained in a previous step.

The lateral data may comprise for instance an information relating to a lateral dimension of the structure at its bottom, or a bottom-CD information. That bottom-CD information may relate for instance to a diameter or a section at the bottom of a hole or a via (TSV), or to the width of a trench at the bottom, or to any dimension between various pattern elements of an etched structure at its bottom. To obtain that bottom-CD information, dimensional measurements are done in the image on the identified bottom of the structure, according to a measurement pattern adapted to the structure of interest.

In the case where the at least one captured image comprises a plurality of bottoms, the image processing allows for determining the lateral data for each of the bottoms.

Figure 3:
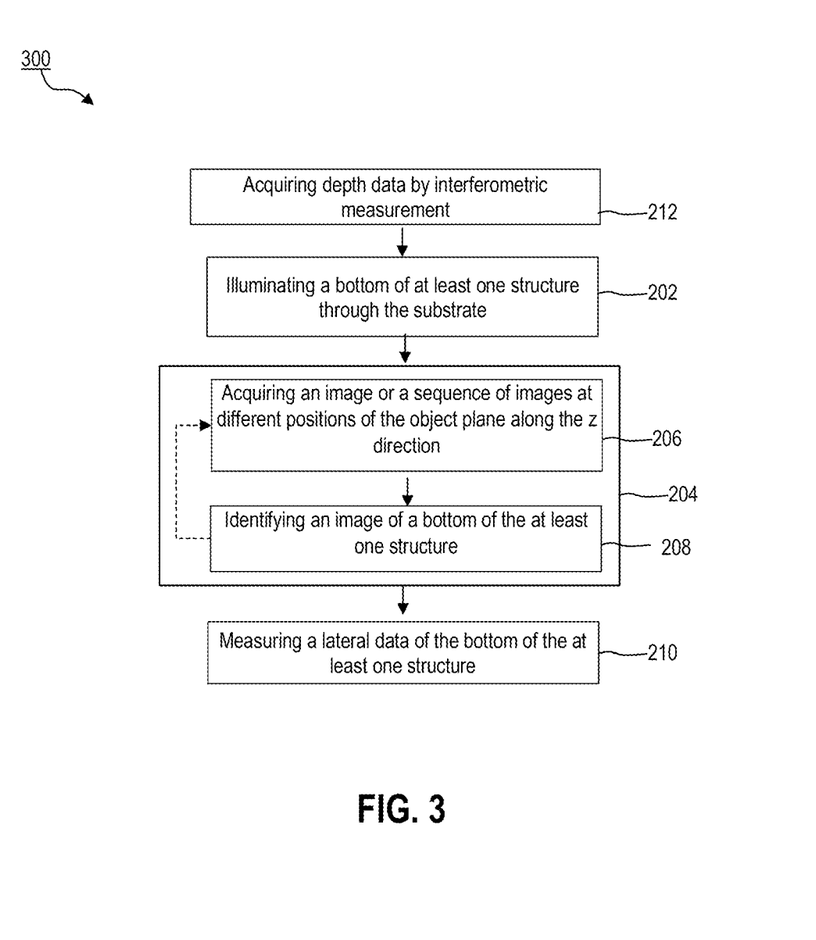

FIG. 3 is a diagrammatic representation of another non-limitative example of a method according to the present invention.

The method 300, shown in FIG. 3, may be used to measure or characterize structures, or HAR structures, etched in a substrate, such as a wafer. More particularly, the method 300 of FIG. 3 may be used to measure a lateral data of a bottom of structures or HAR structures etched in the substrate as well as their depths.

The method 300 comprises an illuminating step 202, a bottom image acquisition step 204, and an image processing step 210. The illuminating step 202, the bottom image acquisition step 204 and the image processing step 210 are realized as described with reference to FIG. 2.

The method 300 further comprises, for at least one structure, an interferometric measurement step 212 during which a depth data relating to the depth of said structure is measured by optical interferometry.

The interferometric measurement is carried out by a low-coherence optical interferometer arranged on the top side of the substrate, such as the one described with reference to the system of FIG. 1.

As explained in relation with FIG. 1, the measurement step 212 provides an interference signal which may then be processed to obtain the depth data.

Optionally, if it is not known by design, the method may also comprise a step of measurement of the total thickness of the substrate, by the same interferometer or another one.

The interferometric measurement step 212 may be realized before, after, or simultaneously with the other steps of method 300 for obtaining lateral data of a bottom of a structure.

If the interferometric measurement step 212 is carried out first, the depth data of a structure, and optionally the thickness information of the substrate obtained in the measurement step 212 may be used to adjust the position of the object plane of the imaging device on the bottom of that structure in the bottom image acquisition step 204. In particular, the focus controller 126 of the system of FIG. 1 may use the depth information of the structure provided by the measurement step 212, and possibly the thickness information of the substrate, in order to position the object plane of the imaging device on the bottom of the structure, or at least to limit the scanning range or the number of images to acquire at step 206 by scanning only through a narrow neighbourhood around the pre-identified bottom position as explained in relation with FIG. 2.

Figure 4:
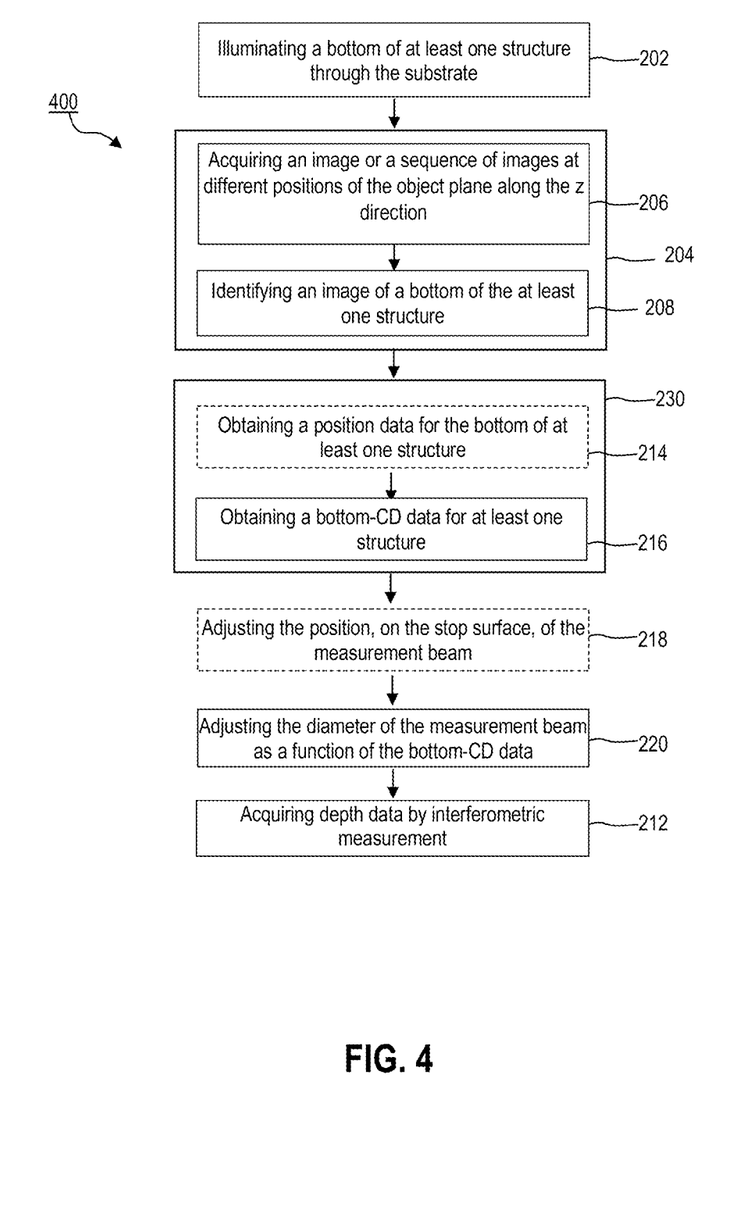

FIG. 4 is a diagrammatic representation of another non-limitative example of a method according to the present invention.

The method 400, represented in FIG. 4, may be used to characterize structures, and in particular HAR structures, etched in a substrate, such as a wafer. More particularly, the method 400 of FIG. 4 may be used to measure a lateral data of a bottom of structures etched in the substrate as well as their depths.

The method 400 comprises the step 202 of illuminating the structure and the step 204 of acquisition of the bottom image, like the methods 200 and 300. The method 400 also comprises the interferometric measurement step 212 of method 300.

The method 400 further comprises an image processing step 230, which comprises all the steps of the image processing step 210 of the methods 200 and 300. In particular, at step 216 a bottom CD information is obtained from the lateral data, in the same way as described in the method 100.

The image processing step 230 may also optionally comprise a processing step 214, wherein a lateral data relating to a position data is obtained. That position data corresponds to the position of the bottom of the at least one structure visible in the image. It may be obtained by finding in the image the coordinates of the bottom of the structure, of an indicator such as the barycentre of the structure.

In some embodiments, only the processing step 216 may be carried out. In some embodiments, both processing steps 214 and 216 may be carried out. In this latter case, processing steps 214 and 216 may be carried out during a single processing step.

The method 400 may comprise an optional step 218 for adjusting the position, on the top surface, of the measurement beam of the interferometer, according to the position data determined at step 214, so that the measurement beam is positioned accurately on the structure that is being characterized. The position of the measurement beam on the top surface may be adjusted by moving the interferometer with respect to the plane of the top surface of the substrate, and/or by moving the substrate with respect to the interferometer.

The method 400, as represented in FIG. 4, further comprises a step 220 for adjusting the diameter of the measurement beam used for interferometric measurements, according to the bottom-CD data. The diameter of the measurement beam is adjusted in order to make sure that the measurement beam enters the structure and reaches the bottom of the structure, in particular for a HAR structure, in order to properly measure the depth of the structure.

The method 400 then comprises an interferometric measurement step 212 as described in the method 300 to measure the depth of the structure. This step is carried out once the measurement beam is properly adjusted at step 220 and optionally at step 218.

Of course, the invention is not limited to the examples detailed above.

While a particular embodiment of the present method and a system for characterising structures through a substrate, have been described herein, it will be appreciated by those skilled in the art that changes and modifications may be made thereto without departing from the invention in its broader aspects and as set forth in the following claims.

The invention claimed is:

1. A method for characterizing structures etched in a substrate, such as a wafer, the substrate having a top side on which the structures are etched and a bottom side opposite to the top side, the method comprising the following steps:

illuminating at least one structure with an illumination beam issued from a light source emitting light with a wavelength adapted to be transmitted through the substrate;

acquiring, with an imaging device positioned on the bottom side of said substrate, at least one image of a bottom of said at least one structure through the substrate, comprising scanning said at least one structure and/or the substrate below said at least one structure along a direction, z, corresponding to a depth direction of said structure, comprising:

moving an object plane optically conjugate of an image plane of the imaging device along the z direction;

acquiring an image or a sequence of images of the object plane at different positions of the object plane along the z direction; and identifying at least one image of a bottom of the at least one structure, acquired with the object plane positioned at a bottom of the at least one structure, comprising:

detecting a transition in the sequence of images between the at least one structure and the substrate below the at least one structure; and measuring the sharpness or the spatial frequencies of the acquired images; and measuring at least one data, called lateral data, relating to a lateral dimension of the bottom of said at least one structure from the at least one acquired image.

2. The method according to claim 1, characterized in that it further comprises a step of measuring at least one depth data relating to a depth of the at least one structure.

3. The method according to claim 2, characterized in that the step of acquiring at least one image of a bottom of the at least one structure is realized using the measured depth data.

4. The method according to claim 2, characterized in that the step of measuring at least one depth data relating to a depth of the at least one structure is carried out with a low-coherence interferometer positioned on the top side of the substrate, and having a point measurement beam.

5. The method according to claim 4, characterized in that the at least one lateral data comprises a position data relating to a position of the bottom of the at least one structure, the method further comprising a step of adjusting the position of the measurement beam on a top surface of the substrate according to the position data.

6. The method according to claim 4, characterized in that the at least one lateral data comprises a bottom-CD data relating to a lateral dimension of the at least one structure at the bottom, the method further comprising a step of adjusting a diameter of the measurement beam according to the bottom-CD data.

7. A system for characterizing structures etched in a substrate, such as a wafer, the substrate having a top side on which the structures are etched and a bottom side opposite to the top side, the system comprising:

at least one light source for illuminating a structure, the at least one light source emitting light of a wavelength adapted to be transmitted through the substrate;

an imaging device positioned on the bottom side of said substrate for acquiring at least one image of the bottom of the structure through the substrate;

focus controlling means configured to scan said at least one structure and/or the substrate below said at least one structure along a direction, z, corresponding to a depth direction of said structure, the focus controlling means being configured to:

move an object plane optically conjugate of an image plane of the imaging device along the z direction;

acquire an image of the object plane at different positions of the object plane along the z direction; and identify at least one image of a bottom of the at least one structure, acquired with the object plane positioned at a bottom of the at least one structure, the focus controlling means being further configured to:

detect a transition in the sequence of images between the at least one structure and the substrate below the at least one structure; and measure the sharpness or the spatial frequencies of the acquired images; and an image processing hardware module for measuring at least one data, called lateral data, relating to a lateral dimension of the bottom of the structure from the at least one acquired image.

8. The system according to claim 7, characterized in that the at least one light source is positioned on a bottom side of the substrate.

9. The system according to claim 7, characterized in that the at least one light source is positioned on a top side of the substrate.

10. The system according to claim 7, characterized in that the imaging device comprises a confocal imaging arrangement.

11. The system according to claim 7, characterized in that the imaging device comprises an imaging arrangement with a numerical aperture at the object equal to or higher than 0.4.

12. The system according to claim 7, characterized in that the imaging device comprises an objective lens with a compensator of spherical aberrations.

13. The system according to claim 7, further comprising a low-coherence interferometer for measuring, with a measurement beam, at least one depth data relating to a depth of the structure.

* * * * *